United States Patent [19]

Larson

[11] 3,992,634

[45] Nov. 16, 1976

[54] TOUCH ACTUATED ELECTRONIC SWITCH INCLUDING PROTECTION FROM HIGH POTENTIAL ELECTRICITY

[75] Inventor: Willis A. Larson, Mequon, Wis.

[73] Assignee: Magic Dot, Inc., Minneapolis, Minn.

[22] Filed: May 9, 1975

[21] Appl. No.: 576,228

[52] U.S. Cl. .......................... 307/116; 317/DIG. 2; 307/308; 340/258 C
[51] Int. Cl.$^2$ ........................................ H03K 13/00
[58] Field of Search .......... 307/116, 117, 205, 208, 307/308, 315; 317/DIG. 2, 246; 200/DIG. 1; 340/258 C, 365 C

[56] References Cited
UNITED STATES PATENTS 3,909,625   9/1975   Colglazier et al. .................. 307/116

Primary Examiner—Herman J. Hohauser
Attorney, Agent, or Firm—James L. Kirschnik; John Phillip Ryan

[57] ABSTRACT

A touch actuated electronic switch is disclosed including at least one surface, accessible to the touch of a human, interconnected with an active circuit and protected against static electricity. In the preferred embodiment, the active circuit is differential sensing circuitry, preferably, dual input logic circuitry, and most requiring protection from static electricity at this time, a MOS exclusive OR gate. In the preferred embodiment where the interconnection between the logic circuit and the surfaces is desired to include long wires, a twisted pair of wires is used if increased noise immunity or noise protection is desired. The twisted pair is interconnected at one end with one wire electrically connected to the touch surface and the other substantially equal length wire being unconnected or connected to a second touch surface. Both wires are connected at their other ends to the dual inputs to the logic circuitry. Also connected to the dual inputs are dual impedances which, when taken together with the impedance of the body of the human operator, provide protection against static or other high potential electricity. A common mode alternating voltage signal is then provided through input circuitry to the logic circuitry, and the output of the logic circuitry is interconnected to an integrator, in the preferred embodiment a capacitor. The integrator is, in turn in the preferred embodiment, connected to an additional amplifier. The output terminals of the additional amplifier, in the preferred embodiment, act as an electrical switch with the electrical impedance across the output terminals in a first state assuming a high impedance, electrical open circuit, or "OFF" switch condition and in the second state assuming a low impedance, electrical short circuit, or "ON" switch condition to thereby approximate the two states of a conventional mechanical electrical switch, the condition assumed by the second amplifier being dependent upon whether or not an operator has touched a touch surface.

35 Claims, 2 Drawing Figures

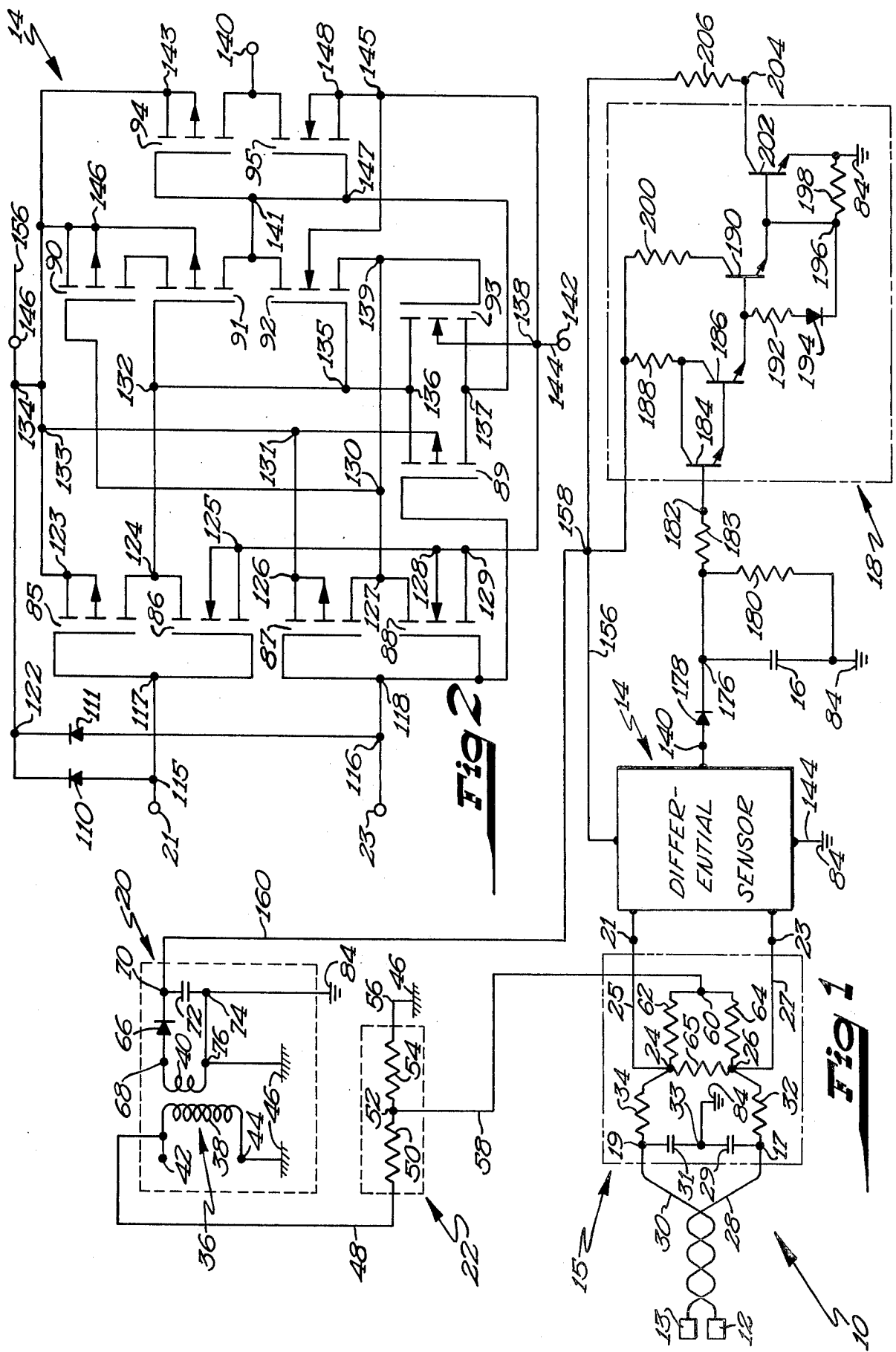

ized as the present invention is being described.

TOUCH ACTUATED ELECTRONIC SWITCH INCLUDING PROTECTION FROM HIGH POTENTIAL ELECTRICITY

BACKGROUND

The present invention generally relates to switches, more particularly relates to electronic switches, still more particularly relates to touch actuated electronic switches, and more particularly still, relates to the protection of touch actuated electronic switches from static and other high potential electricity.

A touch actuated electronic switch which operates upon the mere touch of an operator and without moving parts is deemed desirable to replace mechanical switches in substantially all switch applications.

Further, a touch actuated electronic switch which can be inexpensively fabricated, which can be fabricated in small size, which is reliable, which provides a high noise suppression or immunity, which is easily fabricated, and which operates upon input currents of a level below that dangerous to humans is to be desired.

Furthermore, if electronics is used in such a switch which can be damaged or destroyed by static or other high potential electricity, protection against such damage is to be desired.

The present invention provides a switch having these and other advantages.

SUMMARY

The preferred embodiment of a touch actuated electronic switch of the present invention includes two touch surfaces interconnected by a twisted pair of wires with the dual logic inputs of an exclusive OR logic circuit.

The preferred embodiment also includes a pair of center taped capacitors connected across the dual inputs to provide the static or other high potential protection of the present invention. The center tap of the capacitors is then connected to ground or common.

Also, in the preferred embodiment, a common mode voltage is provided from the conventional A.C. power lines to the dual inputs of the logic circuit. If the logic circuit is to be of the grounded variety, as in the preferred embodiment, this common mode input may be provided by an electrical interconnection to the input power lines. If a switch of the floating variety is desired, this electrical interconnection can be provided, for example, by the electrical oscillation of the secondary winding of a transformer used in the power supply to the switch.

A partial shunt of this common mode input may also be used to increase noise immunity, in the preferred embodiment, in the form of a resistor across the dual inputs to the logic circuitry.

The output from the logic circuitry is then provided, in the preferred embodiment, to an integrating capacitor and to an additional amplifier with sufficient power capabilities to satisfy the needs of the electronic switch.

The use of a differential sensing circuit, in this case logic circuitry, in the switch of the present invention allows increased noise immunity or suppression and thus allows the use of long input wiring where desirable.

Thus, use of the input impedances, in this case center taped capacitors, in the switch of the present invention allows the protection from damage from static and other high potential electricity.

It is thus a primary object of the present invention to provide a novel touch actuated electronic switch.

It is a further object of the present invention to provide such a switch which may be easily fabricated.

It is a further object of the present invention to provide such a switch which may be inexpensively fabricated.

It is a further object of the present invention to provide such a switch which may be fabricated of small size.

It is a further object of the present invention to provide such a switch which is reliable.

It is a further object of the present invention to provide such a switch with high noise suppression or immunity.

It is a further object of the present invention to provide such a switch where sensitivity can be controlled without significant detriment to the switching characteristics.

It is a further object of the present invention to provide such a switch which allows the touch surfaces to be located remotely of the remainder of the switch.

It is a further object of the present invention to provide such a switch which allows an increased suppression of ambient signals unrelated to actuation of the switch.

It is a further object of the present invention to provide such a switch which can operate on input currents of a level below that dangerous to humans.

It is a further object of the present invention to provide such a switch which is protected against the harmful effects of any static or other high potential electricity which may be carried by the user or operator of the switch.

These and further objects and advantages of the present invention will become clearer in light of the following detailed description of an illustrative embodiment of this invention described in connection with the drawings.

DESCRIPTION OF THE DRAWINGS

FIG. 1 shows a schematic/block diagram representation of a touch actuated electronic switch according to the present invention with various portions of the schematic enclosed within dashed and solid lines to indicate major functional blocks.

FIG. 2 shows a preferred embodiment of circuitry usable in the switch of FIG. 1.

DESCRIPTION

In FIG. 1, the touch actuated electronic switch of the present invention, generally designated 10, is shown as including touch surfaces 12 and 13, a differential sensing block 14, input circuitry 15, an integrating means, in the form of a capacitor 16, and an additional amplifier block 18. A power supply providing power to the aforementioned parts is also shown as is a source of common mode alternating voltage signal, designated 22.

With more particularity, touch surfaces 12 and 13 are shown as connected to junction points 17 and 19 of input circuitry 15 to differential sensor 14, in this preferred embodiment an exclusive OR logic circuit. Wire 28 is electrically connected between touch surface 12 and junction point 17. Similarly, wire 30 is electrically connected between touch surface 13 and junction point 19 and is of substantially the same length as wire 28. The twisted pair 28 and 30 is used to obtain a better noise suppression or noise immunity in conjunction with differential sensor 14 when a long input connection is used between touch surfaces 12 and 13 and sensor 14.

Two capacitors, designated 29 and 31, are also connected across junction points 17 and 19. Capacitors 29 and 31 are connected together in a center tapped arrangement, at a junction point 33, which is in turn connected to ground.

Junction point 19 is then connected to a junction point 24 through a resistor 34 inserted to assure a level of current below that dangerous to humans as between touch surface 12 and the remaining electronics. Similarly junction point 17 is connected to a junction point 26 through a resistor 32.

Junction points 24 and 26 are then interconnected with the dual inputs 21 and 23 to sensor 14 by wires 25 and 27, respectively. Also connected to input circuitry junction points 24 and 26 is a common mode alternating voltage signal from blocks 20 and 22.

With more particularity, power supply 20 includes a transformer generally designated 36 having a primary winding 38 and a secondary winding 40. Primary winding 38 includes terminals 42 and 44 connected to a source of alternating frequency power with terminal 44 shown as connected to earth ground, designated 46.

Block 22 is also connected between terminals 42 of transformer 36 and earth ground 46, as by wire 48 having one end connected to terminal 42 and the other end connected to a voltage divider resistor 50. Resistor 50 in turn is connected to a junction point 52 also connected to an additional voltage divider resistor 54 which, in turn, is connected to earth ground 46 by a wire 56. Block 22 is then connected to junction points 24 and 26 by a wire 58 extending between junction point 52 within block 22 and a further junction point 60 within input circuitry 15 which, in turn is connected to junction point 24 through a resistor 62 and to junction point 26 through a resistor 64.

A means for providing an input signal shunt to sensor 14 is shown as resistor 65 connected across junction points 24 and 26.

Thus, input circuitry 15 includes resistors 32, 34, 62, 64, and 65, junction points 17, 19, 24, 26, 33, and 60, capacitors 29 and 31, and wires 25, 27, and 58.

The remaining parts of power supply 20 include a rectifying diode 66 connected between a first terminal 68 of transformer secondary 40 and a junction point 70 also connected to one side of a filtering capacitor 72. The other connection to capacitor 72 is made to a junction point 74 which is also connected to another terminal 76 of transformer secondary 40 and to earth ground 46.

Sensor 14, in the preferred embodiment, is a conventional exclusive OR gate formed of complementary logic gates such as the number MC14507AL or MC14507CL exclusive OR circuitry currently sold by Motorola Semiconductors which uses MOS P-channel and N-channel enhancement mode semi-conductors. Since this logic cell is of the standard type, a type 4030 may also be used and it can be obtained from other manufacturers also. For example, RCA, solid state division, sells a model CD4030 series logic circuit successfully used. The Motorola unit is shown, however, and preferred.

Sensor 14, as seen in FIG. 2, then includes MOS devices 85–95, inclusive, and diodes 110 and 111 interconnected between inputs 21 and 23 and a logic output 140. A bias terminal 142 for logic circuit 14 is connected to circuit ground 84 by a wire 144, and a second bias terminal 146 is connected to a source of D.C. voltage from power supply 20, as available at junction point 70 by means of wire 156, junction point 158, and wire 160.

Output 140 of logic circuit 14 is then connected to a junction point 176 through a diode 178 having its anode connected to junction point 140 and its cathode connected to junction point 176. Junction point 176 is further connected to circuit ground 84 through a parallel connection of capacitor 16 and a resistor 180 forming an integrating means. Junction point 176 is also connected to the input 182 of amplifier 18 through a resistor 183.

Amplifier 18 includes a Darlington arrangement of NPN transistors 184 and 186 having their common collectors connected to junction point 158 through a current limiting resistor 188. The base of transistor 184 is connected to amplifier input 182, while the emitter of transistor 186 is connected to the base of a further NPN transistor 190 and to circuit ground 84 through a series connection of resistor 192, diode 194, junction point 196, and resistor 198. The collector of transistor 190 is also connected to junction point 158 through a further current limiting resistor 200. Junction point 196 is also connected to the emitter of transistor 190 and to the base of a further NPN transistor 202 which has its collector connected to output 204 of amplifier 18 and its emitter connected to circuit ground 84.

The load resistor for the present invention is generally designated 206 and shown as connected between output 204 and junction point 158. It will be recognized by those skilled in the art that load resistor 206 may represent an actual resistor or any other electronic load for switch 10 of the present invention. Depending upon the current requirements of the actual load required to be switched, as represented by load resistor 206, the precise configuration of the electronic switch of the present invention will be set.

Preferred values for various of the components of the switch 10 of the present invention may now be given. The voltage provided by power supply 20 is of a polarity and value compatible with the remainder of the circuit. In the preferred embodiment shown, a voltage at junction point 70 is shown as positive with respect to circuit ground 84 and of a value of 15 volts. No limitation whatever to this polarity or value is intended.

Further, as a general comment, while preferred values of electronic components are given hereinafter, it will be realized by those skilled in the art that no limitation to these values is intended unless specifically indicated. The values are given as a guide and as an aid to persons lawfully using and utilizing the present invention.

The value of resistors 32 and 34 are in the megohm range and, as indicated, are intended to protect the user of the touch surfaces from any possible electrical shock hazard, electrical insulation breakdown, or the like. Resistors 32 and 34 further protect the circuitry of the present invention from damage from voltages existing upon a user, for example static electricity charges. Thus the minimum resistances is dictated by both considerations. Maximum resistances are dictated by practicality of manufacture and by consideration of the currents to be expected through these resistors such that these resistors do not unduly limit input currents.

It has been found that, under certain circumstances, resistors 32 and 34 do not provide sufficient protection from high potential electricity which may be present on the body of a user of the switch. If resistors 32 and 34 are not contaminated, such as to allow a partial shorting of the voltage existing across the bodies of the resistors, and if the resistors are sufficiently long, then for static charges on the body of the user of the switch of from 10-20 kilovolts, resistors 32 and 34 may suffice.

If it is wished to use a thin film or thick film deposition of resistors 32 and 34 to thus conserve space, assembly, and other factors, if resistors 32 and 34 become contaminated, are of insufficient size, or suffer from other effects which can allow a voltage to bridge across them, then assuming a static voltage of twenty kilovolts is carried by the user of the switch, damage can occur to differential sensor 14. This is especially true, in the preferred embodiment, where differential sensor 14 includes MOS devices.

As shown in FIG. 2, diodes 110 and 111 are provided in an attempt to prevent damage to the MOS input circuitry, however, the MOS input gate tolerates extremely low currents, and is basically a five picofarad capacitor. Therefore, with the insertion of high potential static electricity from the user of the switch, in excess of 50 milliamperes can be created, which generally will destroy diodes 110 and 111, and punch through the gates of the MOS devices on the input to differential sensor 14 and destory these MOS devices.

In Minnesota, in the wintertime, with its low attendant humidity, very high charges have been noted on humans, especially with the increasing use of synthetic clothing and carpeting. For example, judging by the length of a spark from the knuckles of a person engaging a standard light switch to the ground screw of the light switch, knowing the dielectric strength of air, and with standard temperature and other conditions prevailing, from twenty-five to fifty kilovolts have been noted as available from humans who may use the switch 10 of the present invention. This 25 to 50 kilovolts is also available on a continuous basis, since the human may recharge in a few steps across synthetic carpeting.

It has been found further that the human body acts, to static charge, approximately as a capacitor in the range of 100 picofarads. Therefore, it has been discovered that the inclusion of capacitors 29 and 31 allow more significant protection of differential sensor 14, for the following reasons.

Assuming that the maximum current which can be withstood by the input devices of differential sensor 14 before damage occurs is approximately 50 milliamperes or slightly below, then with resistors 32 and 34 of a value of approximately one megohm, voltages of 10 to 20 kilovolts at junction points 17 and 19 will not damage differential sensor 14 since the current created will be only ten to twenty milliamperes assuming the effective value of resistors 32 and 34 is the one megohm value at which they are rated. Thus, this current value will not be damaging to differential sensor 14, as has been confirmed under experimental conditions. Thus, resistors 32 and 34 are generally of a value to limit the current caused by any high potential electricity applied to switch 10 to the milliampere range, and this value is generally in the megohm range.

It is to be noted that the maximum current should be calculated under a worse case condition where the maximum voltage to be applied is divided by the effective value of the resistance, rather than a rated value of resistance, if lower than the rated value.

The problem then is to reduce the current created by the static charge carried by a user of switch 10 of the present invention to within acceptable limits. It has been found that inclusion of capacitors 29 and 31 accomplishes this reduction. It is believed that capacitors 29 and 31 effect this protection by a voltage division action with the capacitance of the body, or by a peak current reduction action, or by a combination of these actions.

More specifically, if the body of a user is considered to be a voltage source of 50 kilovolts in series with a capacitance in the range of 100 picofarads, then with resistors 32 and 34 of an effective value of one megohm, and capacitors 29 and 31 in a center tapped arrangement to ground, the switch user's touch of surface 12 effectively creates a resistive capacitive circuit for the alternating frequency static voltage including: the body voltage source, assumed to be 50 kilovolts; the body capacitance, assumed to be in the range of 100 picofarads; capacitor 29; and ground to complete the circuit. Thus, the 50 kilovolt potential of the body of the switch user is effectively divided between the body capacitance and capacitor 29 and the peak currents and rate of current rise are reduced. Therefore, if the capacitor 29 is in the range of the body capacitance, the voltage division between the body capacitance and capacitor 29 reduces the maximum voltage presented to resistors 32 and 34 at junction points 17 and 19 to one-half of the assumed 50 kilovolt body voltage. Also the peak currents and rate of current rise are substantially reduced. Thus, 25 kilovolts is presented to junction points 17 and 19 which has been demonstrated above to be within the range tolerable by differential sensor 14 in the example given. Also, it is believed that the peak currents are reduced, by the present invention, below those which would be caused by the application of 25 kilovolts to junction points 17 and 19.

A similar reaction occurs when touch surface 13 is engaged by the switch user.

Resistors 62 and 64 are in the range of 100 kilohms to 300 megohms with a preferred value in the area of 2.2 megohms to 300 megohms, depending on the switch sensitivity desired. With a low value of resistance, a lower differential signal input is provided to actuate the switch, as will be explained in further detail hereinafter, thus resulting in a lower switch sensitivity. Conversely, a higher value of resistors 62 and 64 allows a higher differential signal which is then available to actuate the switch, thus resulting in a higher switch sensitivity.

Switch sensitivity is to be taken in its normal sense of the amount of input signal required to obtain an output from the switch, with a switch of low sensitivity requiring a higher input signal to obtain an output and a switch of high sensitivity requiring a lower input signal to obtain an output. Applied to the switch of the present invention, a high sensitivity would allow the switch to be operated, for example, with a gloved hand, or at a slight distance from the touch surfaces 12 and 13. Thus, for the purposes of the present applications, the word "touch" is not intended to be limited to actual physical contact of an operator's body with the touch surfaces, but only an approach of the operator's body sufficiently close to the touch surface, while not necessarily contacting the surface, to allow an actuation of the switch. As can be seen, the degree of approach required to actuate is directly related to the sensitivity of the switch.

Resistors 50 and 54 are for voltage division of an alternating voltage signal and are generally in the range of 10 kilohms into the megohm area, depending upon impedance levels, as is well known to those skilled in the art. Also, block 22 including these resistors may take other forms and yet provide the common mode signal requirements of the present invention. These other forms may embody a transformer with an output at the desired voltage, a voltage tap on transformer 36 of power supply 20, a large series resistor to reduce voltage and current to desired values, an oscillator, or the like.

Resistor 65, in the preferred embodiment is in the megohm range, as will be discussed further hereinafter.

Te values of capacitor 16 and resistor 180 are chosen to have a time constant, i.e., the product of the value of the capacitance multiplied by the value of the resistance, which is significantly greater than the period of the alternating voltage signal applied at junction point 60 of input circuitry 15. Thus, for a preferred and assumed frequency of 60 hertz, as discussed below, a value of capacitor 16 of approximately 4,000 picofarads and a value of resistor 180 of 20 megohms yielding an approximate RC time constant of 80 milliseconds has been found to be appropriate. Generally, should the switch of the present invention be designed to be fabricated by integration or thick film techniques, the value of capacitor 16 is chosen sufficiently small to allow such fabrication. The value of resistor 180 is then chosen to be compatible with the chosen value of capacitor 16 according to the above set out constraints.

The alternating frequency for which all values are given is 60 hertz, the conventional power line frequency available without effort in most locations. Other frequencies may be used, both higher and lower than the 60 hertz indicated, with the limitations on frequency arising from availability of a source of oscillation, the desirability of integrating the switch on a substrate, and other limitations more well-known to designers in the art.

Amplifier 18 is discussed in detail in prior applications by the present inventors. Amplifier 18 may also be many other conventional amplifiers providing the current requirements of the switch, as discussed herein, including MOS amplifiers or logic buffers.

The alternating voltage input desired is of a broad range depending upon the sensitivity desired, as will be explained further hereinafter. For the 60 hertz frequency of the preferred embodiment, voltages in the range of four to 150 volts peak to peak have been used successfully. With the 15 volt D.C. supply assumed, in the example, voltages of ten to 150 volts are deemed preferred.

OPERATION

Basically, the switch 10 of the present invention operates upon the touch of surfaces 12 or 13 by an operator. The capacitance of the operator's body, found to be approximately 50–100 picofarads, provides an unbalanced or differential input signal to differential sensor 14, and the following described circuitry comprising the switch amplifer, and this unbalanced or differential input signal affects the charge of capacitor 16. The charge of capacitor 16 then affects the state of amplifier 18 such that the electrical impedance between terminals 204 and circuit ground 84 take a first state assuming a high impedance, electrical open circuit, or OFF switch condition or a second state assuming a low impedance, electrical short circuit, or On switch condition to thereby approximate the two states of a conventional mechanical electrical switch, with the condition assumed by the impedance between terminals 204 and 84 being dependent upon whether or not an operator has touched surfaces 12 or 13.

More particularly, common mode block 22 provides an alternating voltage common mode signal to both inputs 21 and 23 of differential sensor 14, through input circuitry 15. It is a well-known characteristic of an exclusive OR logic circuit that an output is provided by the circuit at any time when the signal inputs provided differ by an amount exceeding the voltage threshold of the circuit. For the MOS circuit shown in FIG. 3, the threshold is approximately one-half of the voltage applied across terminals 142 and 146.

Thus, if no signal whatever is provided to inputs 21 and 23, a logical 0 is provided by sensor 14. Similarly, and more to the point with regard to the present application, a balanced alternating voltage signal applied to inputs 21 and 23 will also result in a logical 0 output. Notice that the signal must not only be balanced in amplitude, but in phase, a characteristic which is used in operating according to the present invention. Notice further that the exact voltage polarity which is associted with a logical 0 or a logical 1 may vary with manufacturers, and is not a factor in the present invention since the exact polarity will only reflect in the design of the succeeding stages and not change the inherent function of the succeeding stages. Note also that because an exclusive OR circuit is used, there is no difference in the output provided at output 140 if the voltage applied to input 21 exceeds or is less than the voltage applied to input 23. In either case, sensor 14 provides a logical 1 of the same polarity at output 140.

Assuming sensor 14 is in a quiescent state, with the alternating voltage signal supplied to input circuitry 15 balanced with respect to the differential inputs 21 and 23, the quiescent voltage at output 140 of sensor 14 is either near the supply voltage appearing at junction point 146 or near the voltage appearing at circuit ground 84. In the preferred circuitry of FIG. 3, the quiescent voltage is near circuit ground 84. Thus, no voltage appears across capacitor 16, and it is uncharged. With no voltage across capacitor 16, no input is provided to amplifier 18 and thus the impedance between amplifier output 204 and circuit ground 84 is substantially an open circuit. In this state, the switch may be considered in an OFF condition.

The particular state of the impedance between output 204 and circuit ground 84 may, however, be controlled to either condition, as by selection of a differential sensor 14 wherein the quiescent condition of output 140 is near the supply voltage appearing at terminal 146. This quiescent condition would result in bias to amplifier 18, and render transistor 202 conducting to thus provide an electrical short circuit across amplifier output 204 and circuit ground 84. Thus, either normal switch condition can be designed as the quiescent condition for the switch of the present invention.

Thus, this flexibility in the components of switch 10 of the present invention allows it to exist in either an ON or OFF switch condition indicated above before the operator's touch and the inverse switch condition after the operator's touch. Further, by appropriate latching or other feedback, the switch 10 of the present invention can be made as a latching switch or any other switch configuration rather than the momentary switch discussed herein.

Assuming a quiescent condition for switch 10 with transistor 202 of amplifier 18 nonconducting and presenting substantially an open circuit between amplifier output 204 and circuit ground 84, the operator's touch or approach at one of surfaces 12 or 13 provides a capacitance between one of the dual inputs 21 and 23 of sensor 14 and ground 46. This additional capacitance unbalances the phase of the alternating voltage signal applied through junction point 60 as it is applied to sensor inputs 21 and 23.

More particularly, assuming that the operator's body provides a capacitance between touch surface 12 and ground 46, this capacitance would appear as between sensor input 23 and ground 46. Assuming the grounded version of the switch 10 of the present invention where earth ground 46 is connected to circuit ground 84, the phase angle of the alternating voltage signal applied to input 23 from block 20 is caused to lag the phase of the alternating voltage signal applied to input 21. Thus, assuming a sufficient phase difference is created, at particular points in each cycle of the applied alternating voltage signal, the difference between the voltage applied to input 21 and that applied to input 23 will differ by an amount exceeding the threshold voltage for the exclusive OR circuit, and an output will be provided in the form of a series of pulses of a width indicating the time during which the threshold condition was exceeded.

Thus, due to the phase shift of the present invention, the train of pulses appearing at output 140, during the times at which the threshold for sensor 14 is exceeded, charge capacitor 16, and the charge upon capacitor 16 in conjunction with resistor 183 appears as a current source to amplifier 18. This input current renders the transistors within amplifier 18 conducting and causes a change of state in switch 10 such that the impedance across amplifier output 204 and circuit ground 84 changes from a high impedance to a low impedance condition.

The manner in which the values of the components are selected for the switch 10 of the present invention may now be explained.

A primary consideration is to provide alternating voltage signals to the dual differential inputs 21 and 23 of sensor 14 which are substantially balanced. This balance is controlled by the values of resistors 62 and 64. Therefore, resistors 62 and 64 have values which are balanced to provide the substantially balanced alternating voltage signal to inputs 21 and 23 of logic circuit 14.

This does not mean that resistors 62 and 64 must be exactly balanced because other circuit parameters, such as the input circuitry of differential sensor 14, may in fact require a slight imbalance. This has been found to be true of the RCA CD4030 series of exclusive OR gates, where one input has a transmission gate in series with the logic. For circuits such as that disclosed in FIG. 2, and assuming other parameters are normally balanced, using resistors of a ten percent tolerance and equivalent resistive rating has been found to result in substantial balance for the switch 10 of the present invention with the inclusion of resistor 65, as discussed below.

The preferred order of design is then to first select a value of resistors 62 and 64 as dependent upon the sensitivity desired, as defined above. Sensitivity, for a capacitive switch, is preferred to be the lowest sensitivity acceptable for the switch application because of the possibility of inadvertant or undesired switch actuation.

If a high sensitivity is desired such that the switch 10 of the present invention can be operated from a gloved hand, at a close approach of the operator or another object, or the like, then the value of resistors 62 and 64 is selected nearer the 300 megohm value given above, assuming the other parameters are as stated. Assuming a lower sensitivity is required to avoid any possibility of an undesired actuation of the switch and an actual firm touch of the operator's finger upon one of touch surfaces 12 or 13, a value nearer five megohm would be selected. The exact value of resistors 62 and 64 depends upon the particular configuration of sensor 14, the length of input wires 28 and 30, the value of the supply voltage available at junction point 70, the value of the alternating voltage signal available at junction point 52, and like considerations which dictate that no actuation of the switch occurs in the quiescent state.

As indicated above, if the value of capacitors 29 and 31 are in the range of the body capacitance, only one-half of the static voltage which may be carried by the body of a switch user is applied to the switch input. If the value of capacitors 29 and 31 are reduced, a higher proportion of the static voltage carried by the body of the switch user is applied, because of the inverse relationship with the capacitive value. Also, if capacitors 29 and 31 are too large, the sensitivity of the switch is reduced in a manner analogous to the reduced sensitivity explained with respect to resistor 65 hereinafter. Therefore, since a lower value of capacitors 29 and 31 allows a maximum sensitivity, values for capacitors 29 and 31 in the range of the body capacitance are deemed preferred. Thus, values in the range of 100 picofarads are to be preferred, and a value of 68 picofarads has allowed successful operation.

Next, in the preferred order of design, the amplitude of the alternating voltage signal is selected. The amplitude is selected by considering the available voltage, as whether the full 150 volt peak to peak normal line voltage is available, only a lower value transformer voltage is available, or whether an artificial voltage must be created. Cost and access to such voltage is a definite factor in any design, since the switch 10 of the present invention should be compatible with the remaining circuitry or other device switched.

Generally, with the practical conditions indicated above in mind, the amplitude of the alternating voltage signal is selected as a fine tuning on switch sensitivity. That is, with a higher voltage, a higher switch sensitivity results because more voltage is available across resistors 62 and 64. Conversely, with a lower value of alternating voltage signal from block 22, a lower switch sensitivity results. Note that the adjustment of alternating voltage signal amplitude is a second order effect to the values of resistors 62 and 64 themselves.

Next, in an original design with newly selected components, it is desirable to check the circuitry for stability, i.e., whether a quiescent condition can indeed be maintained, or whether random actuations of the switch occur from imbalances in resistors 62 and 64, the length of input wiring 28 and 30, other imbalances in the circuit, and like conditions. If a slight imbalance is noted, resulting in a series of rather narrow width spikes at the frequency of the alternating voltage signal, it has been found that the inclusion of resistor 65 across junction points 24 and 26 will bring the switch 10 of the present invention into a stable quiescent condition.

Resistor 65 is considered to have a dual function in allowing a better balance of the alternating voltage signal supplied and as a further fine tuning on the sensitivity. Resistor 65 is considered to desensitize the inputs to a degree to allow for a balanced condition over a wide range of amplitudes of the alternating voltage signal and further to allow for more imbalance in the values of resistors 62 and 64. As can now be seen, if the remainder of the circuit is in complete balance, including the values of resistors 62 and 64, resistor 65 would not be needed since the amplitude of the alternating voltage signal could be used as a fine sensitivity adjust. Also, resistor 65 may not be needed with the circuit of FIG. 1 if the supply voltage to sensor 14, as across terminals 142 and 146, is sufficiently high as to provide a significant threshold for the switch 10.

As a specific example of an operable switch within the ranges indicated above, using the circuitry shown in FIGS. 1 and 2 with resistors 62 and 64 of a value of 22 megohms, capacitors 29 and 31 of a value of 68 picofarads, a value of resistor 65 of 3.3 megohm, a D.C. supply voltage of 3 to 18 volts (for C-MOS semiconductors) and up to 30 volts (for MOS semiconductors), and an amplitude of the alternating voltage input of 5 to 150 volts peak to peak, with 25 to 30 volts nominal, a very stable switch results which will allow a length of twisted pair wires 28 and 30 up to fifty feet, with low capacitance between the pairs, and will require an actual touch of a surface 12 or 13 to provide an actuation of the switch. A value of resistor 65 of 1 megohm can also be used to provide a stable switch. At a value of resistor 65 of approximately 10 megohms, sporadic nonactuated actuation of the switch was noticed in some units.

It is to be noted that the switch 10 of the present invention allows a significant length of wire for twisted pair inputs 28 and 30, in complete contradistinction to many switches of its class known heretofore. This would allow, for example, a hand-held tool to support only touch surfaces 12 and 13 and have the remaining portions of switch 10 adjacent the circuitry or device to be controlled. The limitation on the length of wire tolerable is related to the sensitivity desired, and ultimately to the capacitance of the human to be sensed. It will now be understood by those skilled in the art that if wires 28 and 30 are excessively long, they present a capacitance which will so greatly exceed the approximately 100 picofarad value of the capacitance of the human as to mask the touch of the human and prevent actuation of the switch. Other like effects occur because of excessively long wires 28 and 30, such as those more well known to designers in the art.

It may also be desirable to remove one or more of the connections between circuit ground and earth ground in the switch 10 of the present invention and float the switch with respect to ground. In this case, the circuitry of the present invention may remain unchanged, or block 22 and its associated common mode signal may be eliminated if oscillation is provided to differential sensor 14 through a floating power supply 20 or other technique as set forth in application Ser. No. 340,183, filed Mar. 12, 1973, entitled "Touch Actuated Electronic Switch", in the name of the present inventors. It is preferred, however, even in this case to include a fixed connection between junction point 60 and a circuit reference, such as junction point 70 of power supply 20 now considered to be floating with respect to earth ground as by the removal of the connection between junction point 76 of power supply 20 and earth ground 46. This fixed connection 58 between input circuitry 15 and the remainder of the circuit has been found to provide more reliable actuation of the switch, although in the floating mode, no connection between junction point 60 and the remainder of the circuitry shown is necessary.

Now that the basic teachings of the present invention have been explained, many extensions and variations will be obvious to one having ordinary skill in the art. For example, the exclusive OR circuit 14 specifically shown in FIG. 2 may be replaced by a circuit which is inverting or not inverting, as desired.

Also, circuitry which does not use MOS semiconductors, but transistors or other semiconductor or amplifying devices, is clearly usuable in the switch 10 of the present invention. MOS devices are preferred because they may be integrated and thus fabricated in small size and because they offer a threshold of approximately one-half of the supply voltage applied. Further, MOS devices offer a high input impedance and accept extremely low levels of current which may elminate the use of an additional amplifier or buffer amplifier if other devices are used for the exclusive OR circuit 14. That is, additional amplification or buffer amplifiers may be required prior to input circuitry 15 to sense the low level of current from the human operator or other object. Also, MOS semiconductor devices are particularly susceptible to damage due to high potential electricity.

Further, the output of the switch 10 of the present invention may be quite easily encoded, for example, by providing the output voltage available at junction point 176 in well known coded fashion to several multiple input amplifiers such as amplifier 18. Therefore, when several switches 10 of the present invention are to be located in a given area, such as on a keyboard, an encoded output may be obtained with fewer than one amplifier 18 for each pair of touch surfaces.

Furthermore, the switch 10 of the present invention will operate with a one wire input rather than the double wire input, 28 and 30, shown. It will be realized that this connection may require a balancing capacitor to the unconnected input to thus balance the capacitance of the wire from the sensor input to the touch surface.

Similarly, the switch 10 of the present invention could be operated in an inverse mode where it is purposefully unbalanced and a touch by the operator brings the unit into balance. The mode disclosed is preferred, however, for a much superior reliability.

Still further, the output of the switch 10 of the present invention may be taken from junction point 140 under certain circumstances, thus eliminating the necessity for the diode 178, capacitor 16, resistor 180, and the remaining circuitry associated with amplifier 18. An example of such a circumstance is if the device to be controlled operates during a time period which is quite small by comparison with the time period of the alternating voltage signal input to the switch 10. Such a device, for example, can be a computer which requires the energizing of a flip-flop circuit operating in nanoseconds. As is well known, a single 60 hertz pulse from the switch 10 of the present invention can effect such an energization and no further pulses are necessary and further pulses, as would be provided by the switch 10 of the present invention upon a continued touch of the operator, would not change the state of the flip-flop and thus would be ignored and not detrimental to circuit operation.

Thus, since the invention disclosed may be embodied in other specific forms without departing from the spirit or general characteristics thereof, some of which forms have been indicated, the embodiments described herein are to be considered in all respect illustrative and not restrictive. The scope of the invention is indicated by the appended claims, rather than by the foregoing description, and all changes which come within the meaning and range of equivalency of the claims are intended to be embraced therein.

What is claimed is:

1. A touch actuated electronic switch, including protection from high potential electricity, comprising in combination: sensing means including signal input means and including signal output means for providing an output signal related to an input signal received; a touch surface; resistance means having first and second ends; capacitance means having first and second ends; means for providing an electrical connection between the touch surface and the first end of the resistance means; means for providing an electrical connection between the first end of the resistance means and the first end of the capacitance means; means for providing an electrical connection between the second end of the capacitance means and ground; means for providing an electrical connection between the second end of the resistance means and the signal input means of the sensing means; means for receiving an alternating voltage; means for providing an electrical connection between the receiving means and the sensing means.

2. The switch of claim 1, wherein the sensing means comprises differential sensing means including first signal input means and second input means for receiving differential signals, wherein the means for providing an electrical connection between the second end of the resistance means and the signal input means of the sensing means provides an electrical connection to the first signal input means of the differential sensing means, wherein the means for providing an electrical connection between the receiving means and the sensing means provides substantially equal common mode alternating voltage to the first imput means and the second input means of the differential sensing means, and including: second resistance means having first and second ends; second capacitance means having first and second ends; means for providing an electrical connection between the first end of the second resistance means and the first end of the second capacitance means; means for providing an electrical connection between the second end of the second capacitance means and ground; means for providing an electrical connection between the second end of the second resistance means and the second input means to the differential sensing means.

3. The switch of claim 2, further including integrating means; and means for providing an electrical connection between the signal output means of the sensing means and the integrating means.

4. The switch of claim 3, wherein the resistance means is in the megohm range, and wherein the capacitance means is in the range of 100 picofarads.

5. The switch of claim 3, wherein the resistance means is of a value effective to limit the current caused by high potential electricity applied to the touch surface to the milliampere range; and wherein the capacitance means is of a value in the range of the capacitance of the human body.

6. Te switch of claim 2, wherein the resistance means is in the megohm range; and wherein the capacitance means is in the range of 100 picofarads.

7. The switch of claim 2, wherein the resistance means is of a value effective to limit the current caused by high potential electricity applied to the touch surface to the milliampere range; and wherein the capacitance means is of a value in the range of the capacitance of the human body.

8. The switch of claim 1, wherein the resistance means is of a value effective to limit the current caused by high potential electricity applied to the touch surface to the milliampere range; and wherein the capacitance means is of a value in the range of the capacitance of the human body.

9. The switch of claim 8, wherein the capacitance means is in the range of 100 picofarads.

10. The switch of claim 1, wherein the capacitance means is in the range of 100 picofarads.

11. The switch of claim 1, further including integrating means; and means for providing an electrical connection between the signal output means of the sensing means and the integrating means.

12. The switch of claim 11, wherein the resistance means is in the megohm range; and wherein the capacitance means is in the range of 100 picofarads.

13. The switch of claim 11, wherein the resistance means is of a value effective to limit the current caused by high potential electricity applied to the touch surface to the milliampere range; and wherein the capacitance means is of a value in the range of the capacitance of the human body.

14. The switch of claim 13, wherein the resistance means is in the megohm range; and wherein the capacitance means is in the range of 100 picofarads.

15. A touch actuated electronic switch including protection from high potential electricity, comprising in combination: at least one touch surface; metal-oxide semiconductor switch amplifier means including input means and output means; resistance means including first and second ends; capacitance means including first and second ends; means for providing an electrical connection between the first end of the resistance means and the touch surface; means for providing an electrical connection between the first end of the capacitance means and the first end of the resistance means; means for providing an electrical connection between the second end of the resistance means and the switch amplifier means; means for providing an electrical connection between the second end of the capacitance means and earth ground.

16. The switch of claim 15, further including integrating means; and means for providing an electrical connection between the output means of the switch amplifier means and the integrating means.

17. The switch of claim 16, wherein the resistance means is of a value effective to limit the current caused by high potential electricity applied to the touch surface to the milliampere range; and wherein the capacitance means is of a value in the range of the capacitance of the human body.

18. The switch of claim 17, wherein the capacitance means is in the range of 100 picofarads.

19. The switch of claim 18, wherein the resistance means is in the megohm range.

20. The switch of claim 15, wherein the resistance means is of a value effective to limit the current caused by high potential electricity applied to the touch surface to the milliampere range; and wherein the capacitance means is of a value in the range of the capacitance of the human body.

21. The switch of claim 20, wherein the capacitance means is in the range of 100 picofarads.

22. The switch of claim 21, wherein the resistance means is in the megohm range.

23. The switch of claim 16, wherein the capacitance means is in the range of 100 picofarads.

24. The switch of claim 16, wherein: the switch amplifier means includes a second input means; and including: second resistance means having first and second ends; second capacitance means having first and second ends; means for providing an electrical connection between the first end of the second resistance means and the first end of the second capacitance means; means for providing an electrical connection between the second end of the second capacitance means and earth ground; means for providing an electrical connection between the second end of the second resistance means and the second input means to the switch amplifier means.

25. The switch of claim 24, wherein the resistance means is of a value effective to limit the current caused by high potential electricity applied to the touch surface to the milliampere range; and wherein the capacitance means is of a value in the range of the capacitance of the human body.

26. The switch of claim 25, wherein the resistance means is in the megohm range; and wherein the capacitance means is in the range of 100 picofarads.

27. The switch of claim 25, wherein the capacitance means is in the range of 100 picofarads.

28. The switch of claim 24, wherein the capacitance means is in the range of 100 picofarads.

29. The switch of claim 15, wherein: the switch amplifier means includes a second input means; and including: second resistance means having first and second ends; second capacitance means having first and second ends; means for providing an electrical connection between the first end of the second resistance means and the first end of the second capacitance means; means for providing an electrical connection between the second end of the second capacitance means and earth ground; means for providing an electrical connection between the second end of the second resistance means and the second input means to the switch amplifier means.

30. The switch of claim 29, wherein the resistance means is of a value effective to limit the current caused by high potential electricity applied to the touch surface to the milliampere range; and wherein the capacitance means is of a value in the range of the capacitance of the human body.

31. The switch of claim 30, wherein the resistance means is in the megohm range; and wherein the capacitance means is in the range of 100 picofarads.

32. The switch of claim 30, wherein the capacitance means is in the range of 100 picofarads.

33. The switch of claim 29, wherein the capacitance means is in the range of 100 picofarads.

34. The switch of claim 15, wherein the capacitance means is in the range of 100 picofarads.

35. The switch of claim 15, wherein the resistance means is in the megohm range; and wherein the capacitance means is in the range of 100 picofarads.

* * * * *